(12) United States Patent
Molteberg et al.

(10) Patent No.: US 6,787,233 B1
(45) Date of Patent: Sep. 7, 2004

(54) PARTICLES

(75) Inventors: Astrid Evenrod Molteberg, Ospelia (NO); Arvid Trygve Berge, Trondheim (NO)

(73) Assignee: Dynal Biotech ASA, Oslo (NO)

( * ) Notice: Subject to any disclaimer, the term of this patent is extended or adjusted under 35 U.S.C. 154(b) by 0 days.

(21) Appl. No.: 09/807,839

(22) PCT Filed: Oct. 18, 1999

(86) PCT No.: PCT/GB99/03432

§ 371 (c)(1),
(2), (4) Date: Apr. 18, 2001

(87) PCT Pub. No.: WO00/24005

PCT Pub. Date: Apr. 27, 2000

(30) Foreign Application Priority Data

Oct. 19, 1998 (GB) .............................. 9822822

(51) Int. Cl.[7] .............................................. B32B 15/02
(52) U.S. Cl. .................................................... 428/403
(58) Field of Search ................ 428/403, 407, 428/323, 327; 106/286.7, 403, 287.18

(56) References Cited

U.S. PATENT DOCUMENTS 4,049,752 A * 9/1977 Albers
4,336,173 A 6/1982 Ugelstad ..................... 523/205
5,162,087 A 11/1992 Fukuzawa et al. .......... 252/500
6,344,156 B1 * 2/2002 Yamada et al.
6,469,081 B1 * 10/2002 Chino et al.

FOREIGN PATENT DOCUMENTS

| EP | 0093279 A | 11/1983 | |
| EP | 0242025 A | 10/1987 | |
| EP | 0265212 A1 | 4/1988 | ............ H01R/4/04 |
| EP | 0413161 B1 | 3/1995 | ............ H01R/4/04 |
| GB | WO 93/02112 | 2/1993 | ............ C08F/8/00 |
| JP | 61215602 | 9/1986 | |
| JP | 61215603 | 9/1986 | |
| JP | 61215604 | 9/1986 | |
| JP | 04174980 A | 6/1992 | |
| JP | 05019241 | 1/1993 | |
| JP | 2948038 B | 7/1994 | |
| JP | 08113654 A | 5/1996 | |
| JP | 08167328 A | 6/1996 | |

* cited by examiner

Primary Examiner—H. Thi Le
(74) Attorney, Agent, or Firm—Testa, Hurwitz & Thibeault, LLP

(57) ABSTRACT

The invention provides electroconductive particles comprising a styrene copolymer core and an external gold coating, characterised in that as said copolymer core is used a styrene copolymer comprising less than 50 wt. % styrene residues.

18 Claims, 10 Drawing Sheets

PARTICLES

CROSS-REFERENCE TO RELATED APPLICATIONS

This application is the national phase of International (PCT) Patent Application Serial No. PCT/GB99/03432, filed Oct. 18, 1999, published under PCT Article 21(2) in English, which claims priority to and the benefit of United Kingdom Patent Application No. 9822822.4, filed Oct. 19, 1998, The present invention relates to electroconductive particles, in particular gold-coated polymer microbeads, and to a process for their preparation.

The use of electroconductive particles to achieve an anisotropic electrical connection between electronic components has been described in EP-A-265212 (Japan Synthetic Rubber) and in JP-B-5/19241 (Sumitomo Chemical). Metal coated polymer beads, distributed in an adhesive matrix are disposed between the component surfaces and serve to provide an electrical connection between those surfaces.

In JP-B-5/19241, gold, silver, copper, nickel and aluminum are said to be suitable electroconductive coatings and the polymer is stated to be a styrene copolymer, e.g. with an acrylic acid ester, a methacrylic acid ester, an unsaturated carboxylic acid, a nitrile or a diene. The copolymer must however contain styrene as its principal component and no more than 30 wt. % of the polymer can derive from another ethylenically unsaturated monomer. In the Examples a divinyl benzene:styrene (4:96 wt. ratio) polymer particle is either acid treated, treated with colloidal palladium chloride and then plated with silver or is coated with silver by vacuum vapour deposition.

EP-A-265212 describes the use of polystyrene, styrene/divinylbenzene/methacrylic acid (65:35:5 by weight), methyl methacrylate/divinylbenzene (50:50), and styrene/divinyl benzene/sodium styrene sulphonate (65:30:5) polymer particles. The surfaces of the particles were chemically etched, treated with colloidal palladium chloride and then plated with nickel or copper. Subsequent gold plating of such nickel plated styrene/divinyl benzene/sodium styrene sulphonate particles was also described and the resulting particles displayed the best results in terms of anisotropic conductivity. Indeed Sumitomo refer to gold plating as being especially preferred for obtaining a good stable and long lasting electrical connection.

The electroconductive particles are substantially spherical having an average particle diameter in the micrometer range, e.g. 1 to 50 μm. Gold plated polymer microspheres of this type are available commercially from Sekisui.

In application and subsequent use as electrical connectors, the electroconductive microparticles undergo mechanical and thermal stresses and for optimum performance the coatings should be substantially blemish free. Where inert gold coatings are used, to avoid contamination any underlying non-gold metal coating should not be exposed.

However when gold-plated polymer microspheres produced as described above are examined by electron microscopy, it may clearly be seen that many of the gold surfaces are blemished and incomplete.

We have now found that improved gold-plated styrene copolymer microspheres may be produced by using a styrene copolymer in which styrene is a minor component and/or which incorporates a functionalised comonomer and is palladinated by reaction with a solution of a palladium compound.

Thus viewed from one aspect the invention provides electroconductive particles comprising a styrene copolymer core and an external gold coating, wherein the copolymer core comprises less than 50 wt. % styrene monomers.

Viewed from a further aspect the invention also provides electroconductive particles comprising a styrene copolymer core and an external gold coating, wherein the copolymer core comprises a styrene copolymer produced using styrene and a functionalized comonomer and subsequently palladinated by reaction with a solution of a palladium compound. functionalized comonomer and subsequently palladinated by reaction with a solution of a palladium compound.

Preferably the polymer core in the particles of the invention comprises less than 50 wt. % styrene residues and comprises residues of a functionalized comonomer.

By "functionalized" it is meant that the comonomer contains reactive chemical groups that are not transformed into a non-reactive form by the polymerization reaction. Typically such groups will be pendant from the polymer backbone of the resultant copolymer. Exemplary functional groups include amine, thiol, hydroxyl, amide, ester and oxyacid groups, e.g. carboxyl, sulphonic, phosphoric and phosphonic groups. Preferred functional groups for the ready-to-palladinate particles include groups capable of coordinating palladium, e.g. amino, carboxyl, hydroxyl and sulphonic groups, especially amino groups.

The functional groups in the palladium treated particles need not be the same as in the comonomer used in the polymerization reaction, ie. they may be modified after the copolymer is prepared, e.g. by reaction with a bifunctional agent which serves to introduce the desired functional group. By way of example this may be achieved by reaction of a styrene:divinylbenzene: glycidylmethylmethacrylate copolymer with an aminating agent such as ethylene diamine.

The styrene content of the styrene copolymer in the palladium-treated particles is preferably 0.5 to 98.5 wt %, e.g. 20 to 95 wt. %, more preferably 10 to 75 wt. %, e.g. 25 to 70 wt. %. Where the styrene content is below 50 wt. %, it is preferably 20 to 49 wt. %, e.g. 25 to 45 wt. %, particularly 30 to 45 wt. %.

Where the styrene polymer is crosslinked, the most commonly used cross-linking comonomer is divinylbenzene (DVB). As used, however, DVB generally contains a relatively high proportion (about 20, 35 or 45% wt) of the monoethylenically unsaturated, styrene analog ethylvinylbenzene (EVB), and the styrene content of the polymer may be considered to be the sum of the styrene and the EVB.

The comonomers used with styrene to produce the polymer cores of the particles of the invention may be any comonomers capable of copolymerization with styrene. These will generally be compounds which are mono- or multiply ethylenically unsaturated; examples include acrylic acid esters (e.g. methyl, ethyl, butyl, glycidyl, etc. acrylate), methacrylate acid esters (e.g. methyl, ethyl, butyl, glycidyl, etc. methacrylates), acrylic acid, methacrylic acid, acrylonitrile, methacrylonitrile, α-methyl styrene, vinyl toluene, vinyl chloride, vinyl acetate, vinyl propionate etc. Acrylic and methacrylic acids and especially esters, and mixtures of two or more thereof are preferred. Other multiply ethylenically unsaturated monomers may be used to achieve a degree of crosslinking, e.g. dienes such as butadiene, divinyl benzene, trimethylolpropane acrylate or polyethylene glycol diacrylate, especially divinyl benzene. The proportion of multiply ethylenically unsaturated monomer used will depend on the resilience required of the polymer cores in use but their residues will generally make up from 2 to 30 wt. %, more preferably 5 to 20 wt. %, especially about 10 wt. % of the polymer. The proportion of the functionalized comonomer (e.g. an acrylate or methacrylate ester) will preferably be such that their residues make up 5 to 99.5 wt. %, e.g. 10 to 75 wt. %, more preferably 15 to 70 wt. %, especially 55 to 65 wt. % (e.g. 5 to 60 wt. %, for example 10 to 50 wt %). Particularly satisfactory results have been obtained with a styrene content of 25–35 wt %, a DVB content of 7 to 13 wt % and a methacrylate content of 55 to 65 wt %, and metal-plated particles having a core of such a polymer form a further aspect of the invention.

Particularly suitable copolymers include styrene: divinyl benzene:glycidyl methacrylate and styrene: divinyl benzene:glycidyl methacrylate:butyl methacrylate which may subsequently be aminated by treatment with ethylene diamine.

The polymer particles are preferably substantially spherical and also substantially monodisperse.

Thus the particle size distributions have a coefficient of variation CV of 20% or less, preferably 12% or less, more preferably 5% or less, still more preferably 3% or less, e.g. 1.5 to 2.5%. CV is determined in percent by the formula (standard deviation/mean)×100 where mean is the mean particle diameter and standard deviation is the standard deviation in particle size. CV is normally calculated by fitting a monomodal distribution curve to the detected particle size distribution. Thus some particles below or above mode size may be discounted in the calculation which may for example be based on about 90%, or more preferably about 98%, of the total detectable particle number. CV is often determined on a Coulter LS 130 particle analyser.

Mode particle size for the polymer core in the particles of the invention is preferably 0.5 to 500 μm, more preferably 1 to 250 μm, still more preferably 1 to 50 μm, yet more preferably 1.5 to 20 μm, especially 2 to 12 μm, more especially 3 to 10 μm.

Such substantially spherical and substantially monodisperse polymer particles may be produced by the technique described in US-A-4336173, WO93/02112 (Sinvent), JP-A-86/215602, JP-A-86/215603 and JP-A-86/215604.

As may be seen from the attached Figures, the use of low styrene content styrene copolymers can result in gold-plated microspheres which have a more "furry" surface than those produced with higher styrene contents. This surprising effect results in lesser agglomeration of the particles and may also enable a better electrical contact to be made when the microspheres are sandwiched between electrical component surfaces.

As may also be seen from the attached Figures, the use of styrene copolymers which carry functional groups and are palladinated using a solution (rather than colloid) of a palladium compound results in coatings with fewer defects.

Where "furry" particles are desired, the functional monomer (e.g. methacrylate) content should generally be increased for smaller particle sizes, e.g. 40 wt. % for 7 to 10 μm particles rising almost to 100 wt. % for particles below 4.5 μm.

Gold coating of the styrene copolymer particles may be achieved as described by Sumitomo (supra) and Japan Synthetic Rubber (supra), the contents of which are hereby incorporated by reference. However gold coating is preferably achieved by a multistep process which forms a further aspect of the invention.

According to this aspect the invention provides a process for the production of gold-plated polymer particles, said process comprising:

(i) palladinating functional groups in functional group containing styrene copolymer particles by contacting said particles with a solution of a palladium compound;

(ii) metal plating the palladinated particles with a metal having a standard electrode potential ($E^\theta$) less than that of gold (1.42 V), in the presence of a reducing agent; and (iii) gold-plating the metal plated particles, advantageously to a gold thickness of 50 to 600 Å, e.g. 100 to 400 Å or 50 to 200 Å, preferably about 400 Å.

Conveniently the metal used in step (ii) is one having a standard electrode potential of from −1.0V to +1.0V, e.g. zinc, iron, nickel, tin, lead, copper, chromium or silver. Nickel is especially preferred and the discussion and Examples below focus on the use of nickel. (For standard electrode potentials see for example CRC Handbook of Chemistry and Physics, 70th Edition, 1989, pages D151 et seq).

In the process of the invention, palladination may be achieved with any soluble palladium compound generally using water or another protic solvent. One exemplary complex is ammonium tetrachloro palladate. Advantageously an activator, e.g. dimethylaminoborane (DMAB) is also used. The palladination step is conveniently effected at elevated temperature, e.g. 50 to 70° C., especially about 60° C., and generally may be affected for 10 to 60 minutes, e.g. about 20 minutes.

The palladinated particles may then be nickel plated, or plated with other substrate metal coatings, using conventional electroless plating techniques, e.g. using a solution of a nickel compound (e.g. nickel chloride, nickel sulphate, etc., preferably nickel chloride) and a reducing agent (e.g. DMAB, hydrazine or hypophosphite). Ammonia may be used to achieve a pH of 10.5 to 11.0, optimally 10.8, Generally this electroless plating may be effected at or near ambient temperature and may be effected for about 20 minutes to 1 hour, e.g. 30 minutes. The resulting metal (e.g. nickel) coating is advantageously at least 200 Å thick, preferably 300–1000 Å, e.g. about 400 Å or more preferably about 600 Å. In this metal plating step, it is especially preferable to use DMAB as the reducing agent since this gives particularly good metal coating of the polymer particles.

During the metal-plating of the palladinated particles, it is especially preferred to disperse in the plating solution a stabilizer, e.g. an non-ionic surfactant (e.g. a Pluronic), a polyelectrolyte, a polymer (e.g. a polyelectrolyte), a silane, silicon or most preferably an inorganic oxide particulate, more particularly silica. Finely divided silica, e.g. having particle sizes of 3 to 50 nm, more particularly 5 to 15 nm, are especially preferred. Examples of suitable silicas include Cabosil, Aerosil 972 and, especially Aerosil 200 (available from Degussa, a 7 nm particle size hydrophilic silica). Such silicas may conveniently be used at concentrations of 0.05 to 5 g/L, especially 0.1 to 2 g/L.

The subsequent gold-plating step may again be effected using conventional gold-plating techniques, e.g. using potassium gold cyanide. This plating is preferably effected at elevated temperature, e.g. 70 to 90° C., especially 80° C., and may be effected for example for 20 minutes to 1 hour, e.g. 30 minutes. A "Gold Bath" Aureus from Shipley may conveniently be used.

As with the initial metal coating of palladinated particles, it is especially preferred to use a stabilizer in the gold plating solution. For this purpose, the same stabilizers as mentioned above may be used, especially silicas. Following gold coating, it is also preferred to treat the gold plated particles with a stabilizer to reduce any tendency to agglomerate. In this regard, the preferred stabilizers are thiol stabilizers, especially thiols with hydroxyl, carboxyl, silane or sulphonic acid functionalities, most especially $C_{2-25}$, especially $C_{3-20}$, more especially $C_{5-12}$, e.g. $C_6$, thiols with hydroxyl functionalities, e.g. thiododecanol or more especially thiohexanol. In such thiols, the carbon backbone is preferably linear and $\alpha$, $\omega$ substituted.

Especially preferably, the gold plated particles are treated with the thiol stabilizer, e.g. mercaptohexan-1-ol, for 10 to 100 minutes, e.g. 25 to 35 minutes from ambient temperature at about 60° C. The amount of thiol used is conveniently $4 \times 10^{-7}$ to $4 \times 10^{-5}$ mole/g particles (on a dry solids basis), particularly $10^{-6}$ to $10^{-5}$ mole/g, more particularly 2.5 to $5 \times 10^{-6}$ mole/g.

The gold-plated particles may then be formulated together with an adhesive to produce an electroconductive adhesive. Adhesives as described in Japan Synthetic Rubber (supra), EP-B-413161 and U.S. Pat. No. 5,162,087 may be used, e.g. radiation-curable or thermosetting resins. Such electroconductive adhesive compositions form a further aspect of the present invention. Viewed from this aspect the invention provides an electroconductive adhesive composition comprising an adhesive matrix material with disposed therein electroconductive particles, characterised in that said particles comprise electroconductive particles according to the invention or produced by the process of the invention.

The adhesive compositions of the invention may be used to connect electronic components, as described in EP-A-265212, EP-B-413161 and U.S. Pat. No. 5,162,087 for example. For example, the adhesive composition may be cast into films which are then laid between the components to be electrically connected. Typically such films may be 5–35 µm, preferably 5–20 µm, more preferably 10–15 µm, e.g. about 10 µm, thick.

Thus viewed from a further aspect the invention provides the use of the adhesive composition of the invention for providing an electrical connection (e.g. an isotropic or more preferably anisotropic connection) between electronic components.

Alternatively, the gold plated particles may be provided with an external (external to the gold layer that is) coating of an inorganic or organic material, preferably an electrical insulator, e.g. as described in U.S. Pat. No. 5,162,087, In this way the use of the particles as anisotropic conductors is further facilitated. Such further coated particles and adhesive compositions containing them form a further aspect of the invention. Thus for example the gold-plated particles may be provided with a thin, frangible coating of an insulator polymer, preferably one having a thickness of a few nm, e.g. 5–20 nm. In this way, a larger number of particles can be added to the adhesive since in-plane conduction is prevented.

As mentioned above, the palladinated particles may if desired be metal-coated with other metals than nickel, e.g. silver, copper, zinc, tin, etc. and such metal-coated particles (which may if desired subsequently be gold-plated) form a further aspect of the invention.

The gold- or other metal-plated particles of the invention may be used for purposes other than providing electrical connections. Thus for example they may be used in almost any of the currently existing uses for gold and gold-plated microbeads, e.g. in medical diagnostic assays, in gene therapy. Likewise they may be used in antibacterial, antifungal, anticorrosion, and antistatic applications, in paints, in polymer products (e.g. sheets, plates, moulded articles, etc.), in electromagnetic field shielding, in flooring products, etc. The particles may be formulated for such use in a conventional manner, e.g. by mixing with polymer moulding powder, by addition to adhesive compositions, by mixing with a paint base, etc. Such products and uses form further aspects of the invention. Viewed from one such aspect the invention provides a formed polymer product (e.g. a moulded article, a sheet, etc.) characterised in that metal-plated (i.e. plated with gold, nickel or other metals) polymer particles according to the invention are dispersed in the polymer. Viewed from another such aspect the invention provides a coating composition (e.g. a paint) comprising a liquid carrier with dispersed therein metal-plated polymer particles according to the invention.

Patent and other publications referred to herein are hereby incorporated by reference.

BRIEF DESCRIPTION OF THE DRAWINGS

The invention will now be described further with reference to the following non-limiting Examples and the accompanying drawings, in which.

Figure 1:
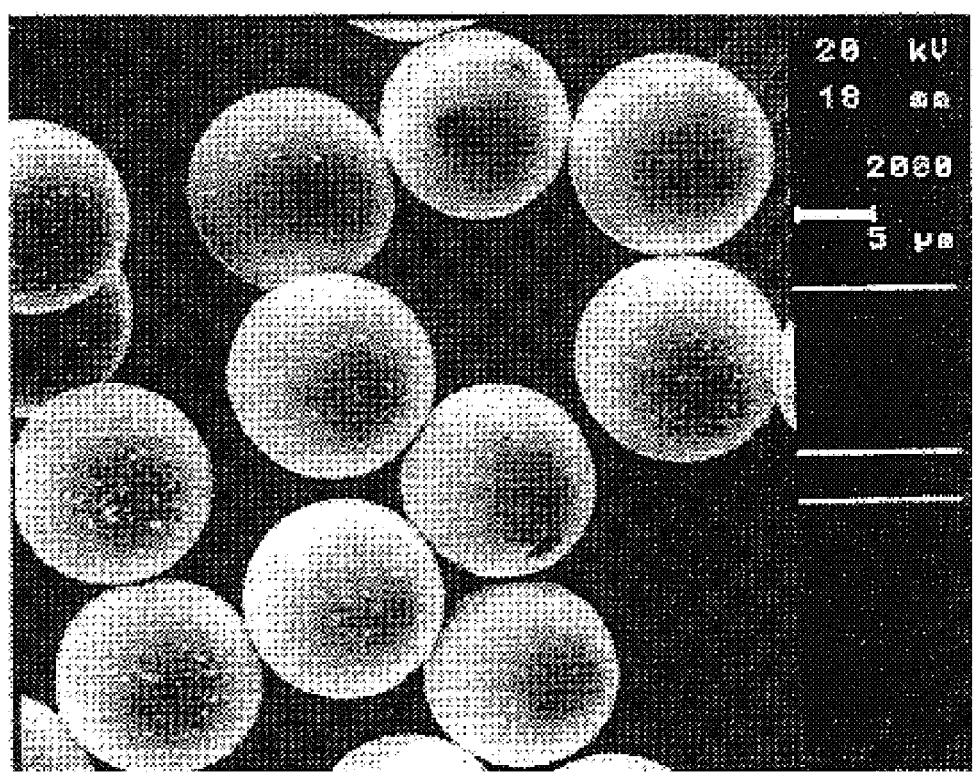
FIGS. 1 to 9 are scanning electron micrographs of gold-plated or nickel plated styrene polymer microparticles.

In the Examples below where DVB is used as a crosslinking comonomer, the percentage DVB is the value for DVB itself—the EVB contaminant is included in the value given for the styrene (ST) monomer. In these Examples the EVB content of the DVB used was 35% wt. Thus for example 10% DVB, 30% ST means 10% DVB, 5.4% EVB and 24.6% pure styrene.

EXAMPLE 1

Preparation of gold-plated low styrene content styrene copolymer particles using particles with a reactive group conditioned surface.

Starting Particles

In this Example, 5 µm styrene copolymer particles (60% glycidyl methacrylate: 10% DVB: 30% ST) produced by the method of U.S. Pat. No. 4336173 and subsequently treated with ethylene diamine were used.

Activation

Part 1—In a 2L reactor an aqueous solution containing 50 g 10 wt % of the particles was heated to 60° C. While stirring at 200 rpm, a solution of 200 ml 0.05 wt % ammonium tetrachloro pallade was charged and the mixture reacted for 25 minutes. The mixture was decanted and the particles were left to settle. The particles were washed with water until the wash water was clear.

Part 2—In a 2L reactor the palladium activated particles were heated to 60° C. While stirring at 200 rpm, a solution of 400 ml 10% borane dimethylamine complex was charged and the mixture reacted for 15 minutes. The activated particles were washed on a nutch, using an amount of washing water twice the reaction volume.

Nickel Plating

In a 10L reactor a nickel-solution was prepared by mixing 8L water, 2L PVP-solution containing 50 g/L K-30, 200 g tetra sodium pyrophosphate, 75 g nickel-chloride and 60 ml ammonia. The mixture was stirred until dissolved at a temperature of 22.5±2° C. 50 g activated particles were charged. While stirring at 300 rpm a solution of 250 ml 10% borane dimethylamine complex was charged and the mixture reacted for 30 minutes. The mixture was decanted and the particles were left to settle. The particles were washed with water until the wash water was clear.

Gold Plating

In a 10 L reactor a gold-solution was prepared by mixing 6L water, 4.5L AREUS 7950 from Shipley, and 70 g potassium gold cyanide. The bath was heated to 75±5° C. While stirring at 300 rpm 50 g nickel plated particles were charged and the mixture reacted for 35 minutes. The mixture was decanted and the particles were left to settle. The particles were washed with water until the wash water was clear and then with methanol. The particles were dried at 50° C. for 12 hours.

Example 1 may be repeated using 200 μm styrene copolymer particles (30% glycidyl. methacrylate: 30% butyl methacrylate: 10% DVB: 30% ST) prepared by the process of U.S. Pat No. 4336173 and subsequently treated with ethylene diamine.

EXAMPLE 2

Preparation of gold-plated low styrene content styrene copolymer particles.
Starting Particles In this Example 5 μm styrene copolymer particles (45% ST:2% DVB: 53% glycidyl methacrylate) are used.
Etching In a 2L reactor 1L chrome sulphuric acid from Merck is heated to 65° C. While stirring at 400 rpm, 50 g dry particles is charged and the mixture reacted for 10 minutes. The particles are washed on a nutch, using an amount of washing water twice the reaction volume.
Neutralising In a 2L reactor an aqueous solution containing 10 g sodium pyrosulfite is stirred at 400 rpm at room temperature, 50 g etched particles are charged and the mixture reacted for 15 minutes. The particles are washed on a nutch, using an amount of washing water twice the reaction volume.
Conditioning In a 2L reactor 1L 0.5% DODUPRINT 218 from Doduco in water is heated to 25° C. While stirring at 400 rpm, 50 g etched particles are charged and the mixture reacted for 10 minutes. The particles are washed on a nutch, using an amount of washing water half the reaction volume.
Activation In a 2L reactor 1L LeaRonald SMT Catalyst, from LeaRonald which consists of palladium-chloride, is heated to 30° C. While stirring 50 g particles is charged and the mixture reacted for 10 minutes. The particles are washed on a nutch, using an amount of washing water twice the reaction volume.
Nickel Plating In a 10L reactor a nickel-solution is prepared by mixing 8L water, 2L PVP-solution containing 50 g/L K-30, 200 g tetra sodium pyrophosphate, 75 g nickel-chloride and 60 mL 28% ammonia. The mixture is stirred until dissolved at a temperature of 22.5±2° C. 50 g activated particles is charged. While stirring at 300 rpm a solution of 250 ml 10% borane dimethylamine complex is charged and the mixture reacted for 30 minutes. The mixture is decanted and the particles are left to settle. The particles are washed with water until the wash water is clear.
Gold Plating In a 10L reactor a gold-solution is prepared by mixing 6L water, 4.5L AREUS 7950 from Shipley, and 70 g potassium gold cyanide. The bath is heated to 75±5° C. While stirring at 300 rpm 50 g nickel plated particles are charged and the mixture reacted for 35 minutes. The mixture is decanted and the particles are left to settle. The particles are washed with water until the wash water is clear and then with methanol. The particles are dried at 50° C. for 12 hours.

EXAMPLE 3

Preparation of gold-plated high styrene content styrene copolymer particles using particles with a reactive group conditioned surface.

Example 1 is repeated but using particles of 70% ST: 10% DVB: 20% glycidyl methacrylate which have been treated with ethylene diamine.

EXAMPLE 4

Preparation of gold-plated low styrene content styrene copolymer particles using particles with a reactive group conditioned surface.
Starting Particles In this Example, 4 μm styrene copolymer particles (30% glycidyl methacrylate: 30% butyl methacrylate:10% DVB: 30% ST) produced by the method of U.S. Pat. No. 4,336,173 and subsequently treated with ethylene diamine were used.
Activation Part 1—In a 2L reactor 50 mL of an aqueous dispersion containing 50 g of the particles was heated to 60° C. While stirring at 200 rpm, a solution of 600 ml 0.05 wt % ammonium tetrachloro pallade was charged and the mixture reacted for 25 minutes. The mixture was decanted and the particles were left to settle. The particles were washed with water until the wash water was clear.

Part 2—In a 2L reactor the palladium activated particles were heated to 60° C. While stirring at 200 rpm, a solution of 75 ml 10% borane dimethylamine complex in water was charged and the mixture reacted for 15 minutes. The activated particles were washed on a nutch, using an amount of washing water twice the reaction volume.
Nickel Plating In a 15L reactor a nickel-solution was prepared by mixing 8L water, 2L of a polyvinylpyrrolidone solution containing 50 g of polyvinylpyrrolidone K-30 (from Fluka) per litre water, 200 g tetra sodium pyrophosphate decahydrate, 100 g nickel-chloride hexahydrate, 60 ml 25% ammonia solution and 1L of a silica dispersion containing 10 g Aerosil 200 (from Degussa) in water. The mixture was stirred at a temperature of 22.5±2° C. until all ingredients (except the silica) had dissolved. 50 g activated particles were charged. While stirring at 300 rpm a solution of 250 ml 10% borane dimethylamine complex in water was charged and the mixture reacted for 30 minutes. The dispersion was decanted and the particles were left to settle. The particles were washed with water until the wash water was visually clear.
Gold Plating In a 15L reactor a gold-solution was prepared by mixing 6L water, 4.5L AREUS 7950 from Shipley, 45 g potassium gold cyanide and 1L of a silica dispersion containing 2.5 g Aerosil 200 in water. The bath was heated to 75±5° C. While stirring at 300 rpm a dispersion of 50 g nickel plated particles in 1L water was charged and the mixture reacted for 35 minutes. The mixture was decanted and the particles were left to settle. The particles were washed with water until the wash water was visually clear. The gold plated particles were then charged into a 3L reactor, heated to 60° C.±5° C. and 25 μL mercaptohexan-1-ol was charged. The mixture was reacted for 30 minutes, cooled and then washed with methanol. The particles were dried at 50° C. for 12 hours.

Example 4 may be repeated using 200 μm styrene copolymer particles (30% glycidyl methacrylate: 30% butyl methacrylate: 10% DVB: 30% ST) prepared by the process of U.S. Pat. No. 4,336,173 and subsequently treated with ethylene diamine.

EXAMPLE 5

Preparation of gold-plated low styrene content styrene copolymer particles.

Starting Particles

In this Example 10 μm styrene copolymer particles (98% ST:2% DVB) are used.

Etching

In a 2L reactor 1L chrome sulphuric acid from Merck is heated to. 65° C. While stirring at 400 rpm, 50 g dry particles is charged and the mixture reacted for 10 minutes. The particles are washed on a nutch, using an amount of washing water twice the reaction volume.

Neutralising

In a 2L reactor an aqueous solution containing 10g sodium pyrosulfite is stirred at 400 rpm at room temperature, 50 g etched particles are charged and the mixture reacted for 15 minutes. The particles are washed on a nutch, using an amount of washing water twice the reaction volume.

Conditioning

In a 2L reactor 1L 0.5% DODUPRINT 218 from Doduco in water is heated to 25° C. While stirring at 400 rpm, 50 g etched particles are charged and the mixture reacted for 10 minutes. The particles are washed on a nutch, using an amount of washing water half the reaction volume.

Activation

In a 2L reactor 1L LeaRonald SMT Catalyst, from LeaRonald which consists of palladium-chloride, is heated to 30° C. While stirring 50 g particles is charged and the mixture reacted for 10 minutes. The particles are washed on a nutch, using an amount of washing water twice the reaction volume.

Nickel and Gold Plating

This was effected as in Example 4.

EXAMPLE 6

Electron Micrography

Figure 2:
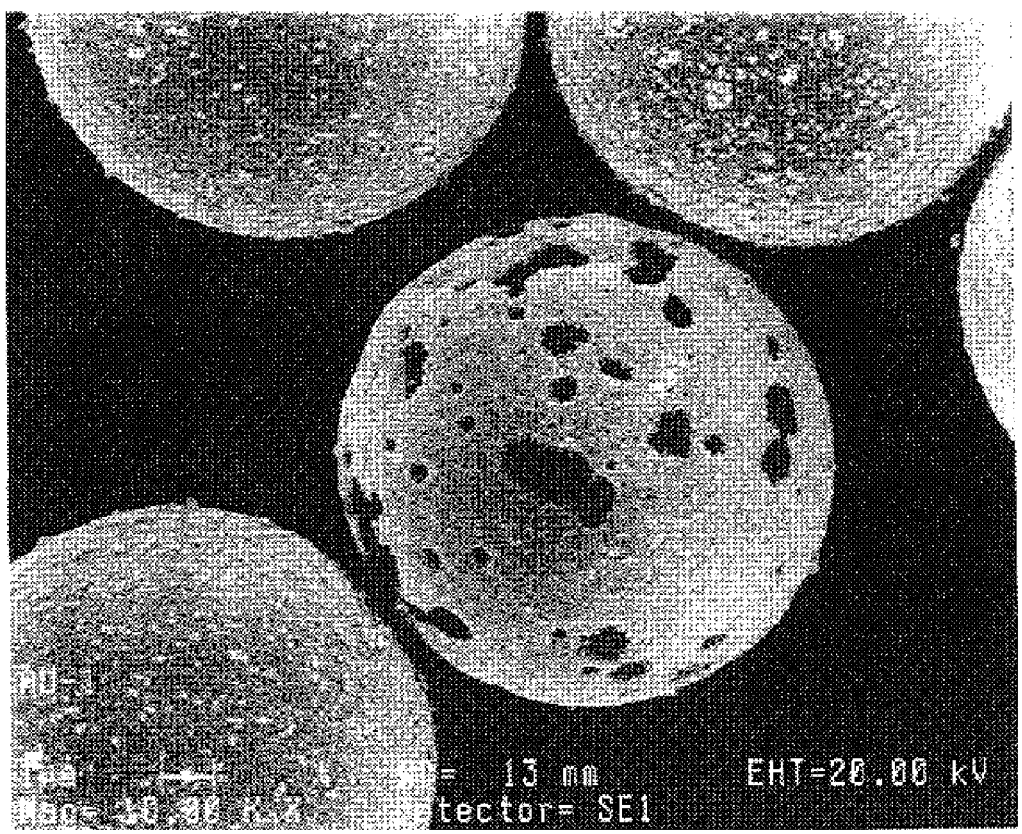
Figure 3A:
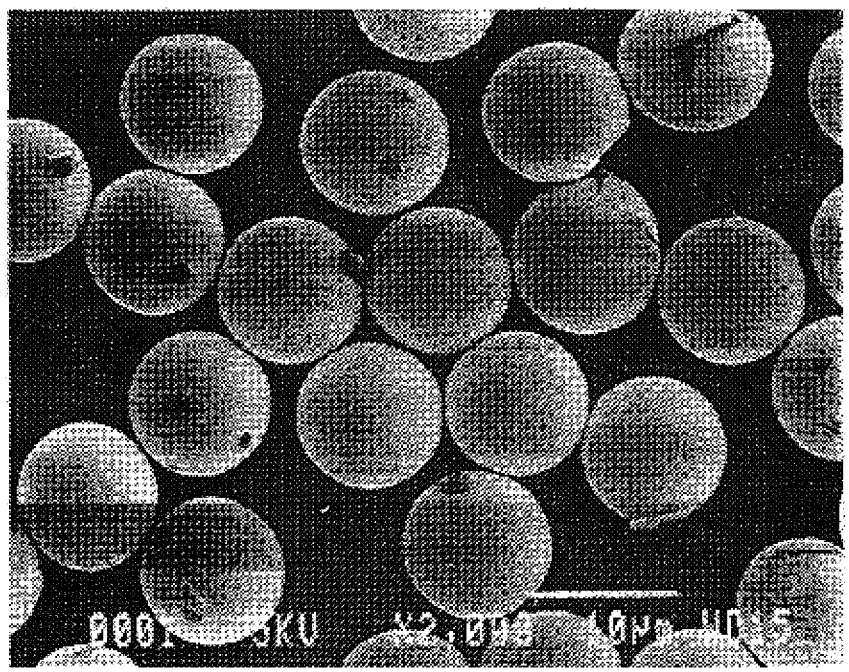
Figure 3B:
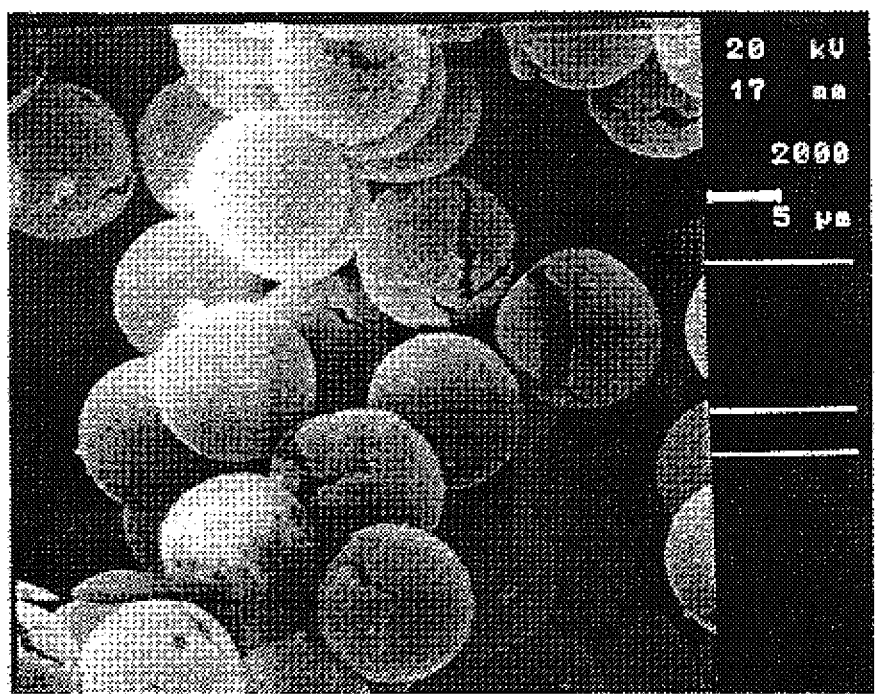
Figure 4:
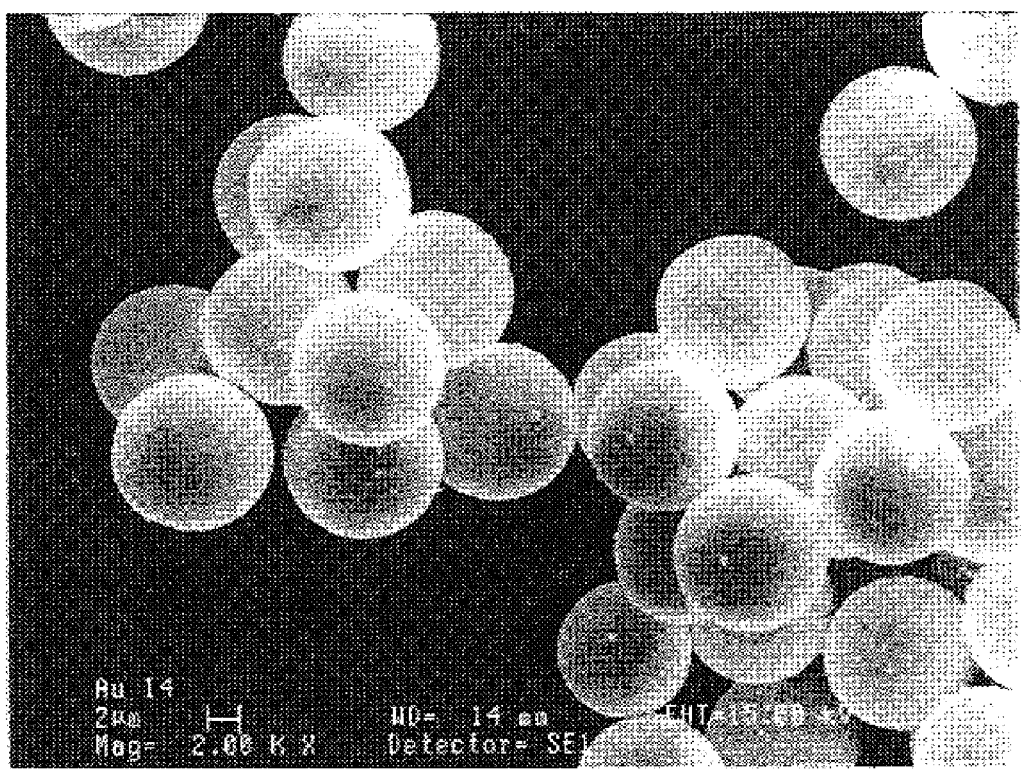
Figure 5A:
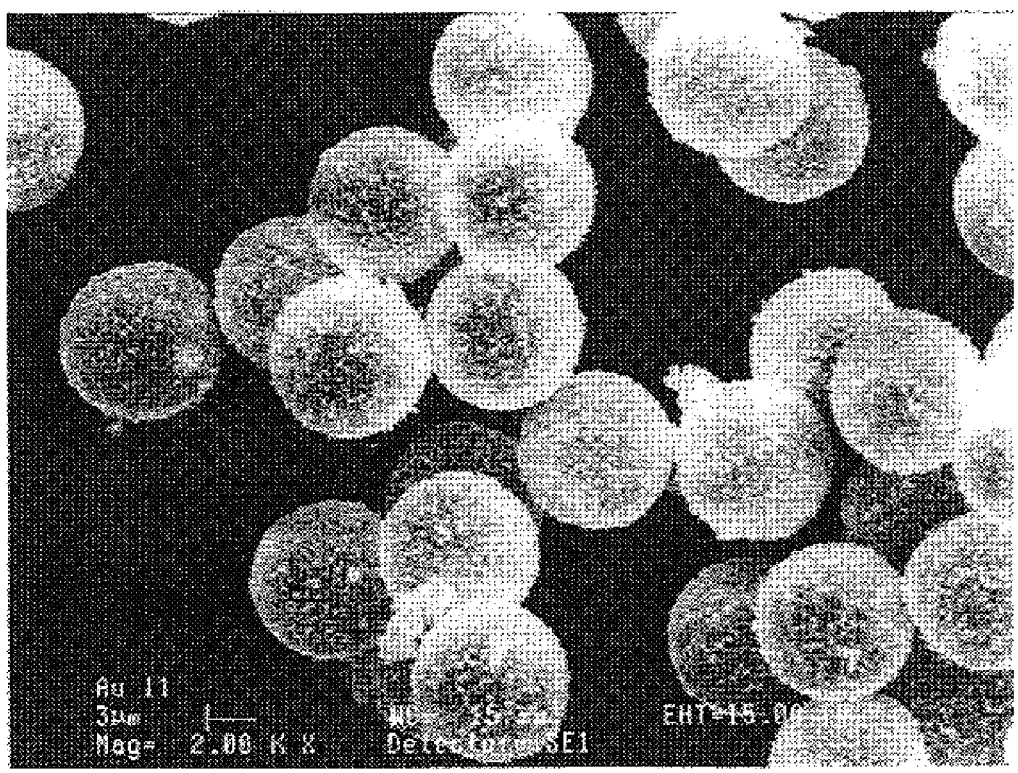
Figure 5B:
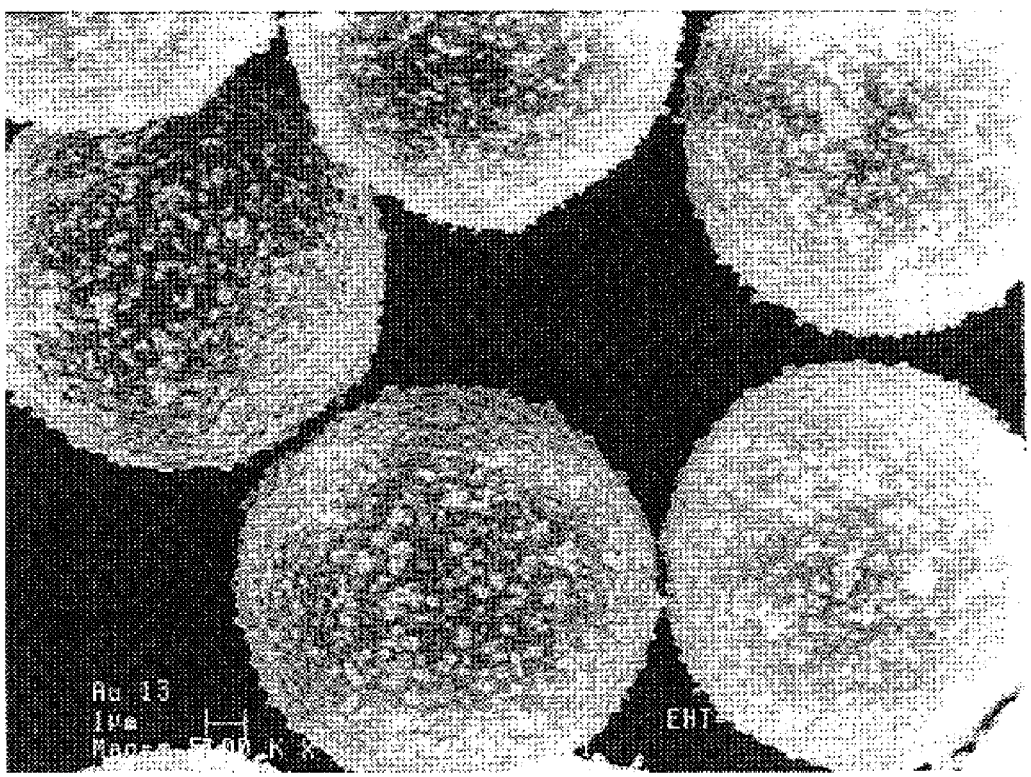
Figure 6:
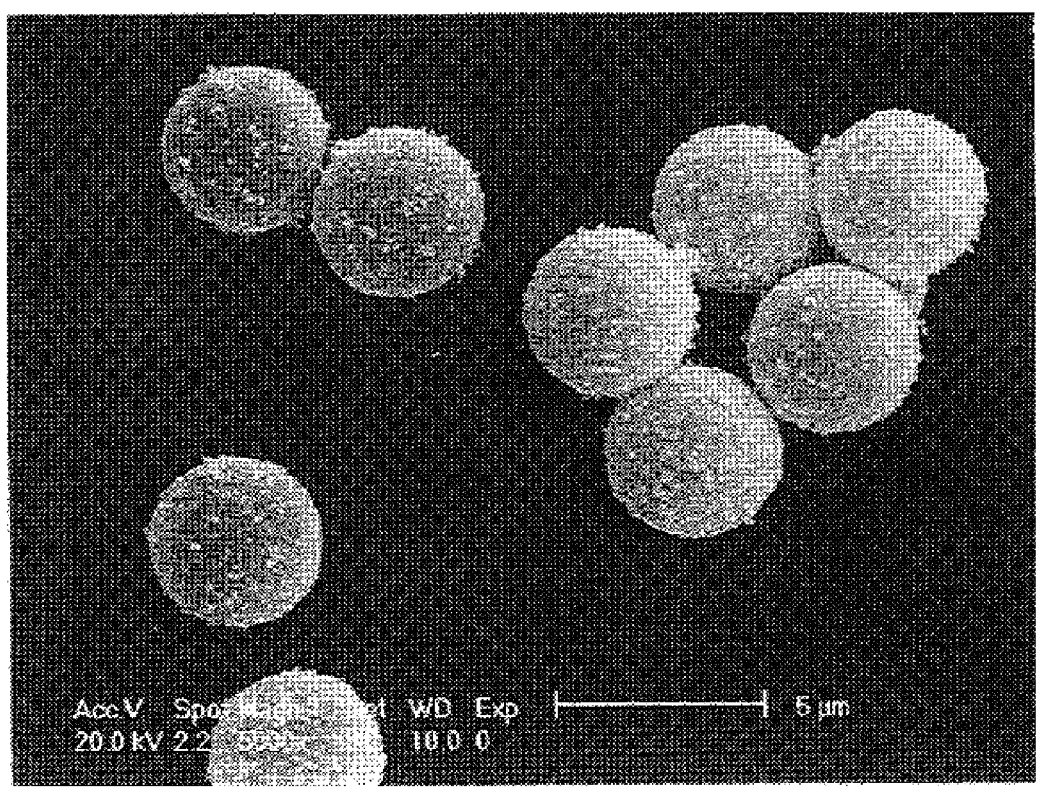
Figure 7:
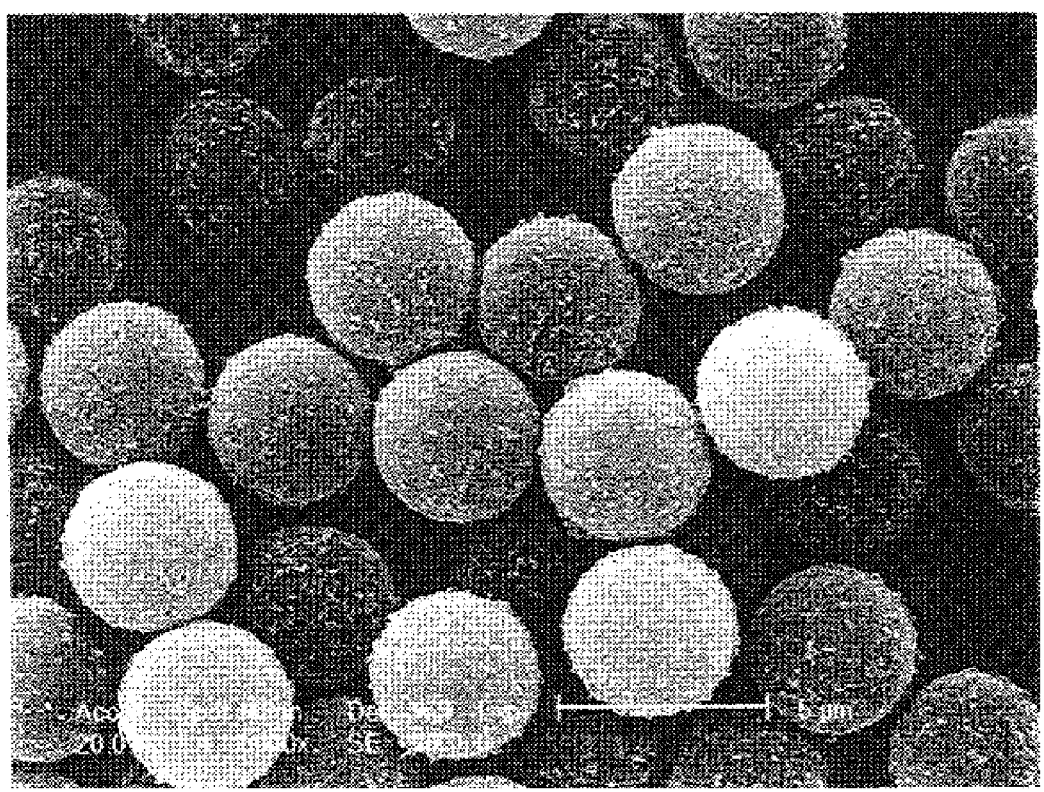
Figure 8:
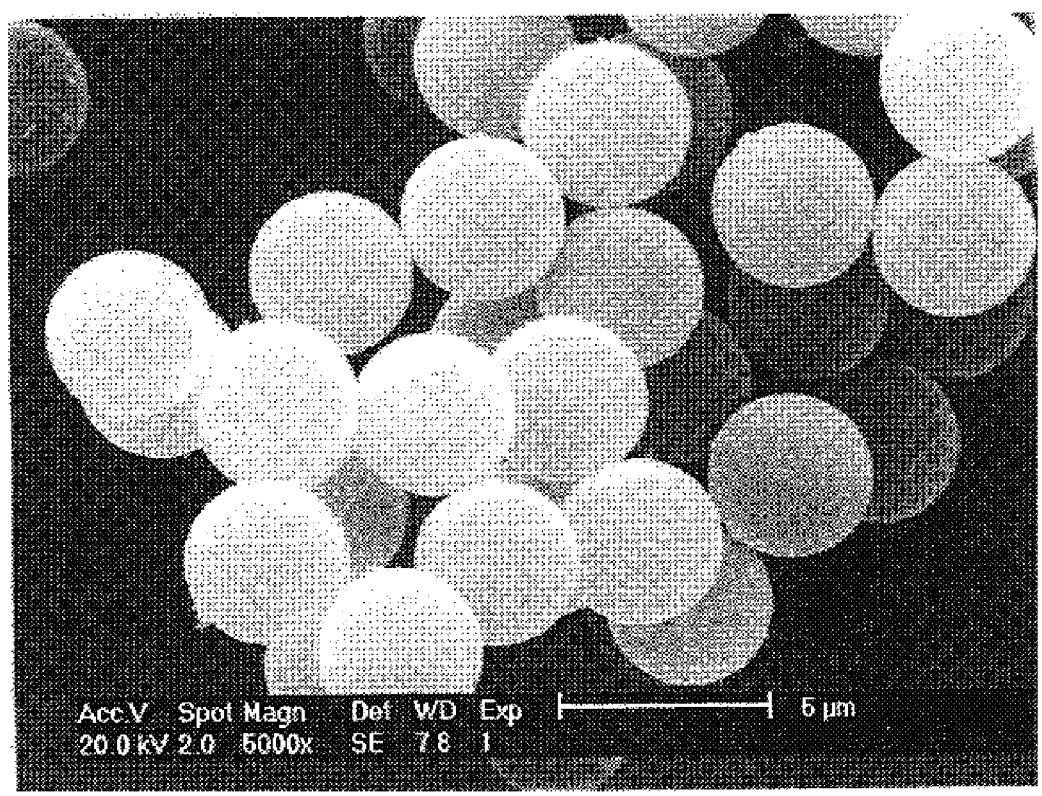
Figure 9A:
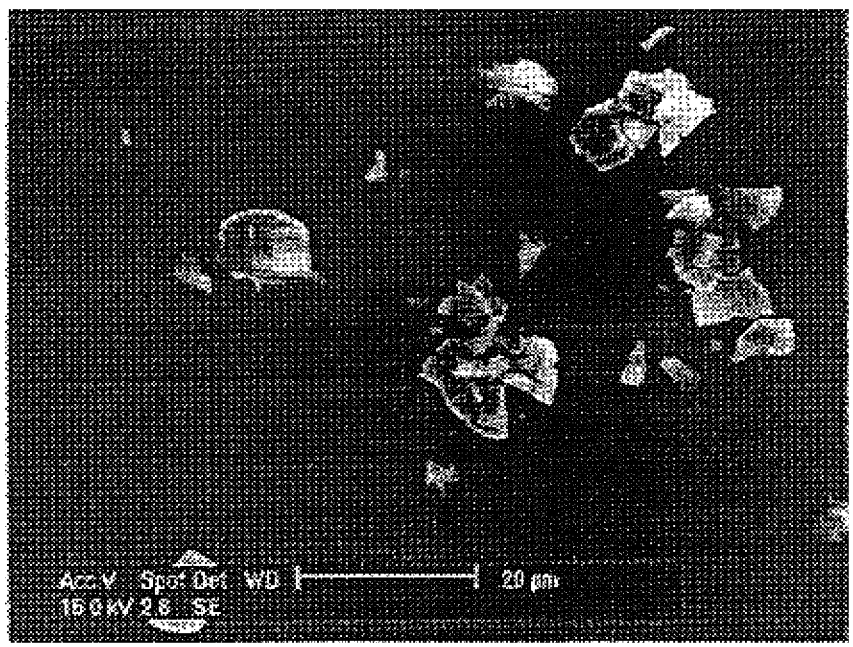
Figure 9B:
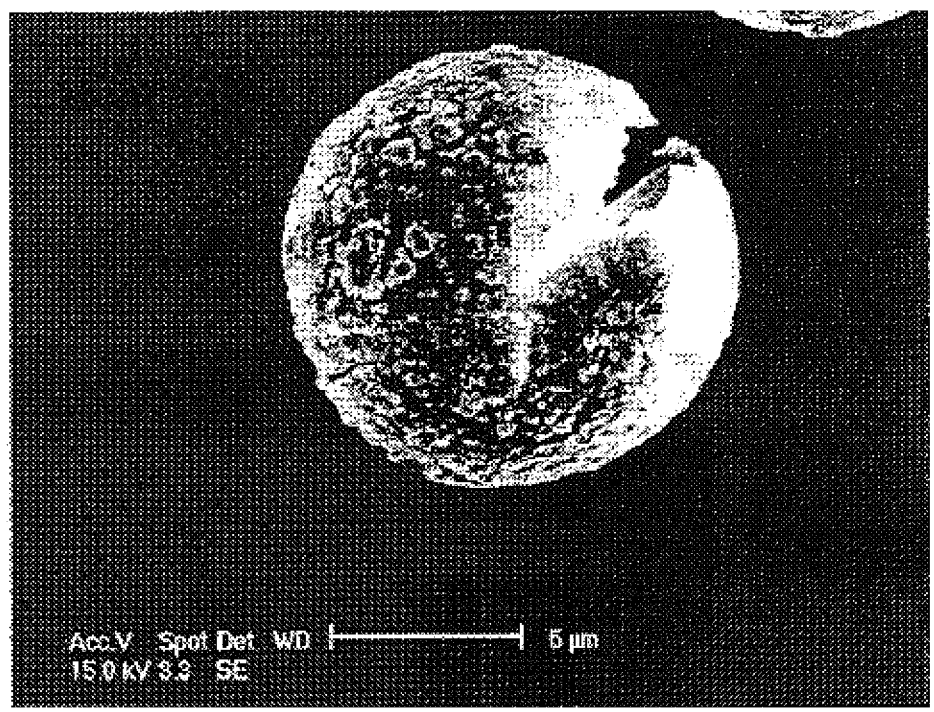

Scanning electron micrographs of the following gold-plated polymer microspheres appear in the accompanying Figures:

| | |
|---|---|
| FIG. 1: | 11.5 μm particles commercially available from Sekisui |
| FIG. 2: | 10 μm 98% ST, 2% DVB gold-plated particles |
| FIG. 3a and 3b: | 10 μm 98% ST, DVB gold-plated particles |
| FIG. 4: | 10 μm 70% ST, 10% DVB, 20% glycidyl methacrylate gold-plated particles according to Example 3 |
| FIG. 5a and 5b: | 10 μm 50% ST, 10% divinylbenzene, 40% glycidyl methacrylate gold-plated particles prepared analogously to Example 1 |
| FIG. 6: | 4 μm 30% glycidyl methacrylate, 30% butyl methacrylate, 10% divinyl benzene, 30% ST gold-plated particles according to Example 4 |
| FIG. 7: | 4 μm 30% glycidyl methacrylate, 30% butyl methacrylate, 10% divinyl benzene, 30% ST nickel-plated particles according Example 4 (surfaces show silica stabilizer particles) |
| FIG. 8: | 4 μm 30% glycidyl methacrylate, 10% divinyl benzene, 30% ST gold-plated particles prepared according to Example 4 but without use of silica stabilizer |
| FIG. 9a and 9b: | gold plated particles of FIG. 1 (11.5 μm) and Example 4 (however of 10.6 μm rather than 4 μm diameter) following heating to 150° C. and application pressure; the particles of FIG. 1 broke at a pressure of about 700 mg/particle while those of FIG. 6 withstood pressures of up to 1100 mg/particle. |

What is claimed is:

1. Electroconductive particles comprising a styrene copolymer core and an external gold coating, said styrene copolymer core consisting of a palladium-coated styrene copolymer, wherein said styrene copolymer is a copolymer of styrene and a functionalized comonomer.

2. Particles as claimed in claim 1 wherein the copolymer core has a styrene content of 0.5 to 98.5 wt %.

3. Particles as claimed in claim 1 wherein the copolymer core comprises less than 50 wt. % styrene monomers.

4. Particles as claimed in claim 1 having a nickel coating interior to said gold coating.

5. Particles as claimed in claim 4 wherein said nickel coating has a thickness of 200 to 1000 Å.

6. Particles as claimed in claim 1 wherein said gold coating has a thickness of 50 to 600 Å.

7. Particles as claimed in claim 1 wherein the styrene copolymer is selected from the group consisting of styrene acrylic acid ester, styrene methacrylic acid ester and mixtures thereof.

8. Particles as claimed in claim 1 wherein the gold coating is surface treated with a thiol.

9. Particles as claimed in claim 1 having a mode particle diameter of 0.5 to 500 μm.

10. The electroconductive particles as claimed in claim 1 coated with a non-conductive coating.

11. An electroconductive adhesive composition comprising an adhesive matrix material with electroconductive particles disposed therein, said electroconductive particles comprising a styrene copolymer core and an external gold coating, said styrene copolymer core consisting of a palladium-coated styrene copolymer, wherein said styrene copolymer is a copolymer of styrene and a functionalized comonomer.

12. The use of an adhesive composition as claimed in claim 11 for providing an electrical connection between electronic components.

13. Use as claimed in claim 12 for providing an anisotropic electrical connection between electronic components.

14. The electroconductive adhesive composition as claimed in claim 11, wherein the styrene copolymer core comprises less than 50 wt. % styrene monomers.

15. A formed polymer product comprising electroconductive particles dispersed in a polymer, said electroconductive particles comprising a styrene copolymer core and an external gold coating, said styrene copolymer core consisting of a palladium-coated styrene copolymer, wherein said styrene copolymer is a copolymer of styrene and a functionalized comonomer.

16. The formed polymer product as claimed in claim 15, wherein the styrene copolymer core comprises less than 50 wt. % styrene monomers.

17. A coating composition comprising electroconductive particles dispersed in a liquid carrier, said electroconductive particles comprising a styrene copolymer core and an external gold coating, said styrene copolymer core consisting of a palladium-coated styrene copolymer, wherein said styrene copolymer is a copolymer of styrene and a functionalized comonomer.

18. The coating composition as claimed in claim 17, wherein the styrene copolymer core comprises less than 50 wt. % styrene monomers.

* * * * *